(12) United States Patent
Beltran et al.

(10) Patent No.: US 10,511,118 B2
(45) Date of Patent: Dec. 17, 2019

(54) RECEPTICLE ASSEMBLY WITH THERMAL MANAGEMENT

(71) Applicant: YAMAICHI ELECTRONICS USA, INC., San Jose, CA (US)

(72) Inventors: Noah Beltran, San Leandro, CA (US); Takeshi Nishimura, Santa Clara, CA (US)

(73) Assignee: YAMAICHI ELECTRONICS USA, INC., San Jose, CA (US)

(*) Notice: Subject to any disclaimer, the term of this patent is extended or adjusted under 35 U.S.C. 154(b) by 0 days.

(21) Appl. No.: 15/840,829

(22) Filed: Dec. 13, 2017

(65) Prior Publication Data
US 2019/0181582 A1    Jun. 13, 2019

(51) Int. Cl.
| | |
|---|---|
| *H01R 13/00* | (2006.01) |
| *H01R 13/514* | (2006.01) |
| *G06F 1/20* | (2006.01) |
| *H05K 3/00* | (2006.01) |
| *H01R 13/6594* | (2011.01) |

(52) U.S. Cl.
CPC .......... *H01R 13/514* (2013.01); *G06F 1/20* (2013.01); *H05K 3/00* (2013.01); *H01R 13/6594* (2013.01)

(58) Field of Classification Search
CPC ................................ H01R 13/514; G06F 1/20
USPC ...... 439/196, 487; 361/679.54, 701, 702, 703
See application file for complete search history.

(56) References Cited

U.S. PATENT DOCUMENTS

| 7,764,504 | B2* | 7/2010 | Phillips | ............... G02B 6/4246 |
| | | | | 165/80.2 |
| 8,830,679 | B2* | 9/2014 | Scholeno | ........... H01R 13/6595 |
| | | | | 165/80.2 |
| 9,668,378 | B2* | 5/2017 | Phillips | .................. H01R 24/60 |
| 2012/0202370 | A1* | 8/2012 | Mulfinger | ............ H01R 12/737 |
| | | | | 439/329 |
| 2013/0164970 | A1* | 6/2013 | Regnier | ............. H05K 7/20509 |
| | | | | 439/487 |
| 2014/0154912 | A1* | 6/2014 | Hirschy | ............ H01R 13/6595 |
| | | | | 439/487 |
| 2015/0132990 | A1* | 5/2015 | Nong Chou | ......... G02B 6/4266 |
| | | | | 439/487 |
| 2015/0280368 | A1* | 10/2015 | Bucher | ............... H01R 13/665 |
| | | | | 439/487 |
| 2017/0054234 | A1* | 2/2017 | Kachlic | ............... H01R 12/712 |

* cited by examiner

*Primary Examiner* — Abdullah A Riyami
*Assistant Examiner* — Nelson R. Burgos-Guntin
(74) *Attorney, Agent, or Firm* — Womble Bond Dickinson (US) LLP

(57) ABSTRACT

A method and apparatus are disclosed herein for managing thermal dissipation in a receptacle assembly. In one embodiment, the receptacle assembly comprises a cage with a front face, a rear face, the front face having a plurality of ports; and a heat transfer unit having a thermal interface disposed with the cage, one or more heat transfer bars coupled, via openings in the cage, to sides of the thermal interface and are external to the cage, and a heat sink coupled to the one or more heat transfer bars, where the heat transfer unit is movable in a vertical direction in response to insertion of a module into one of the plurality of ports.

26 Claims, 8 Drawing Sheets

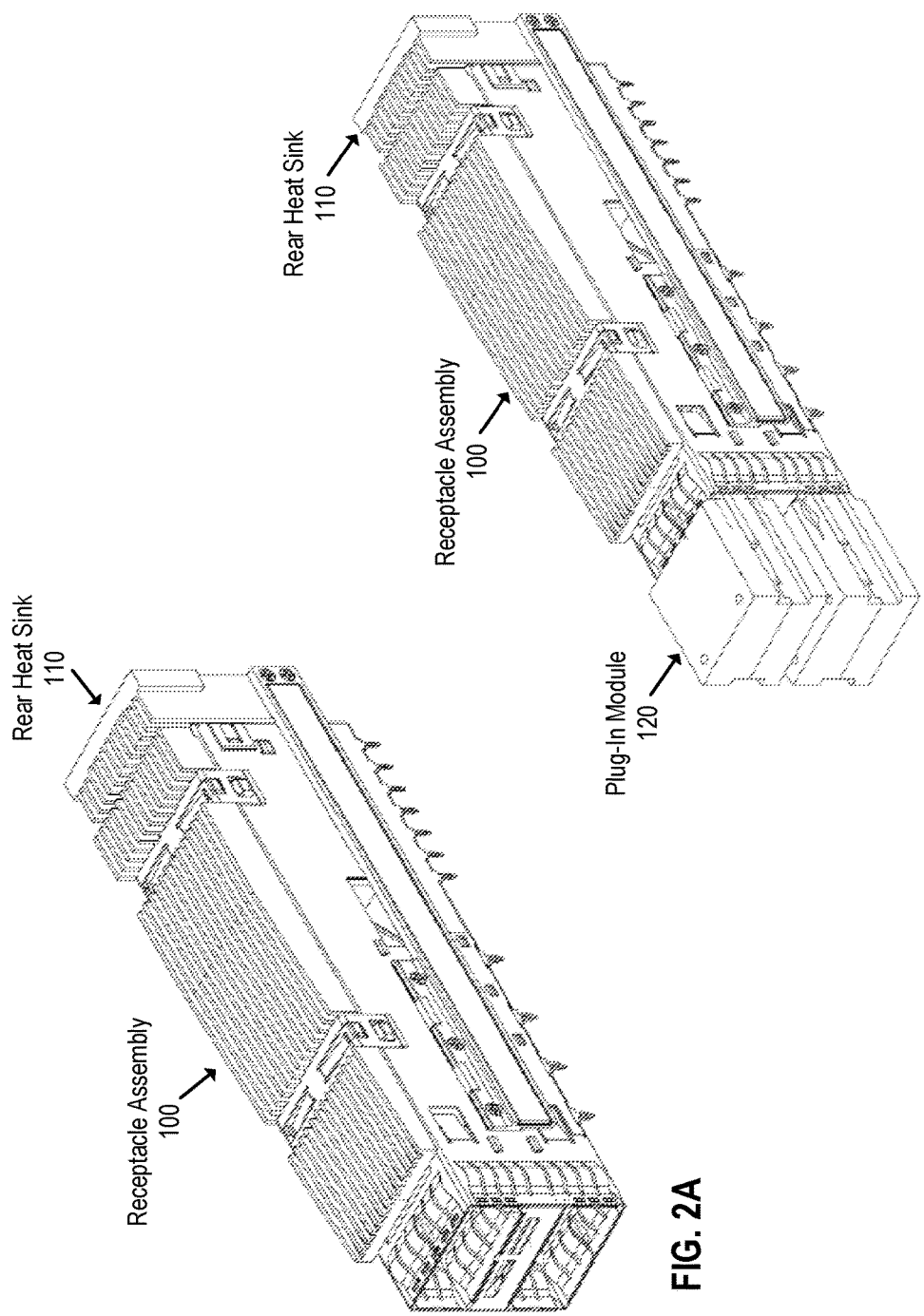

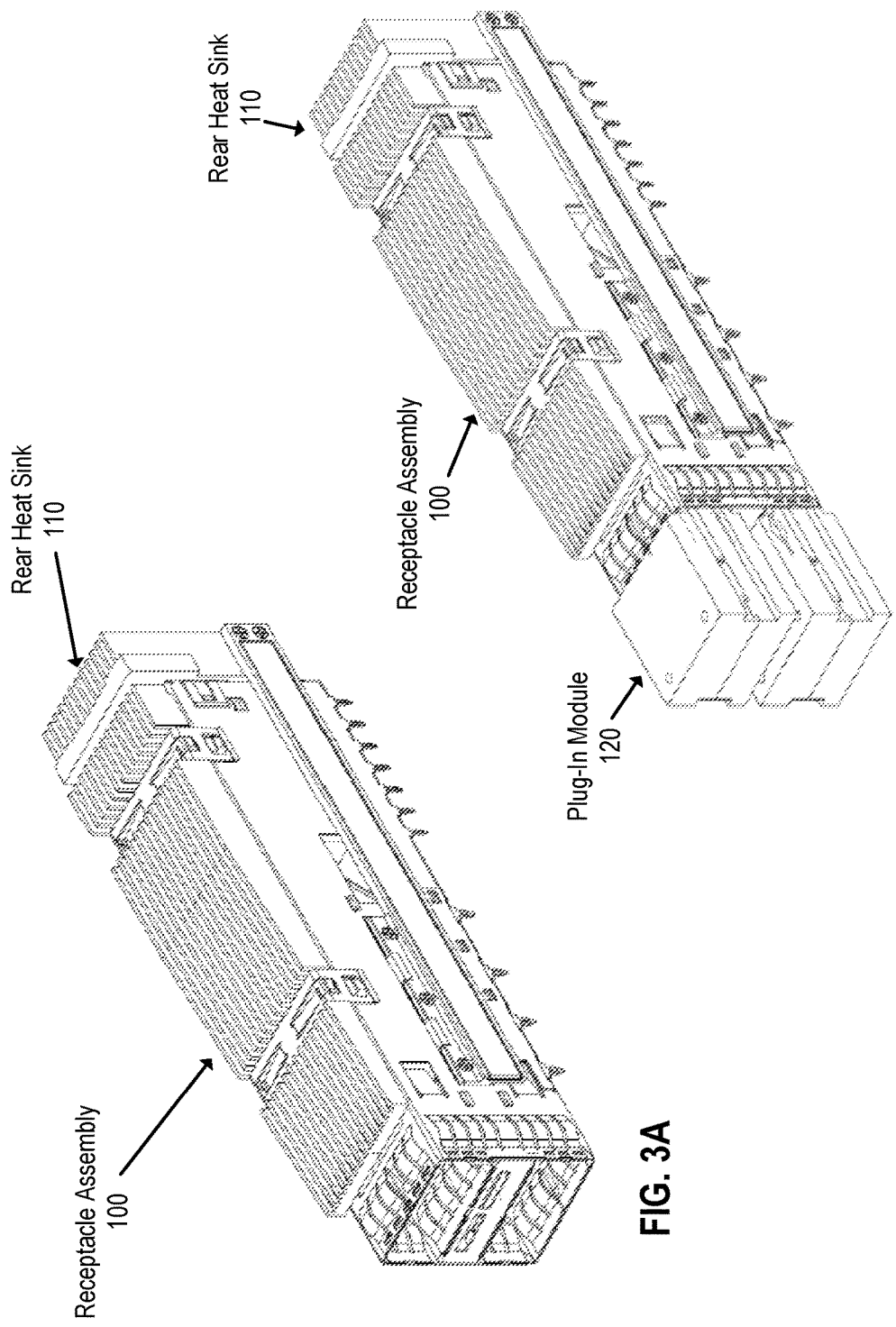

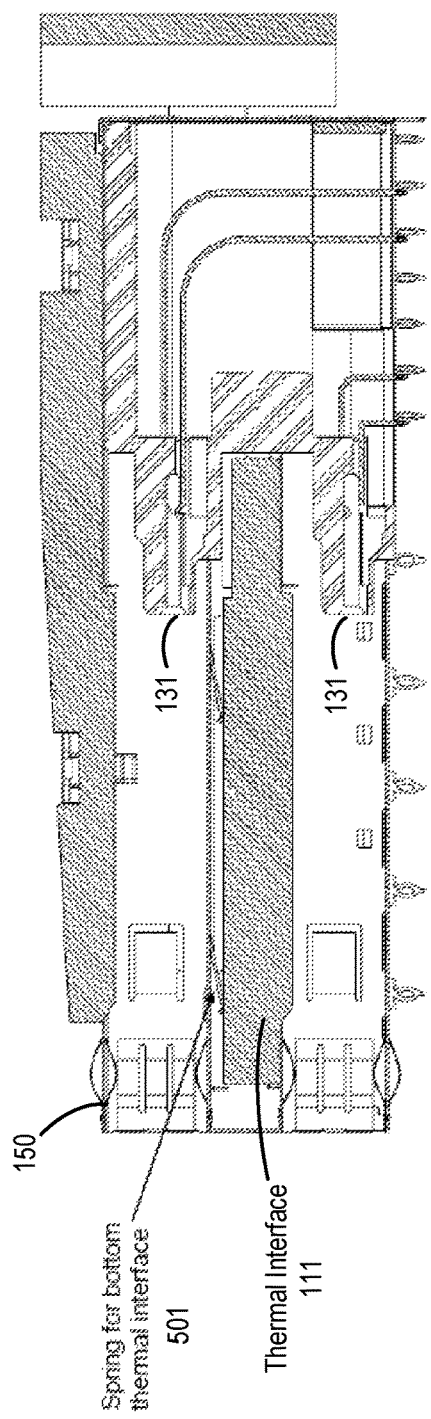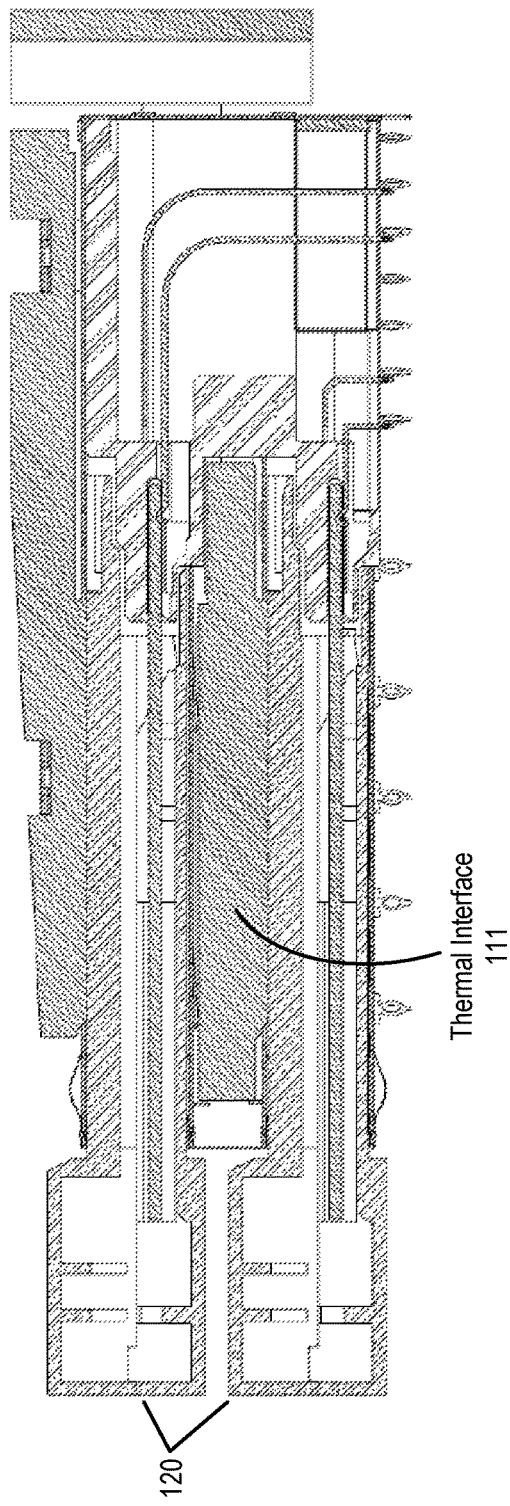

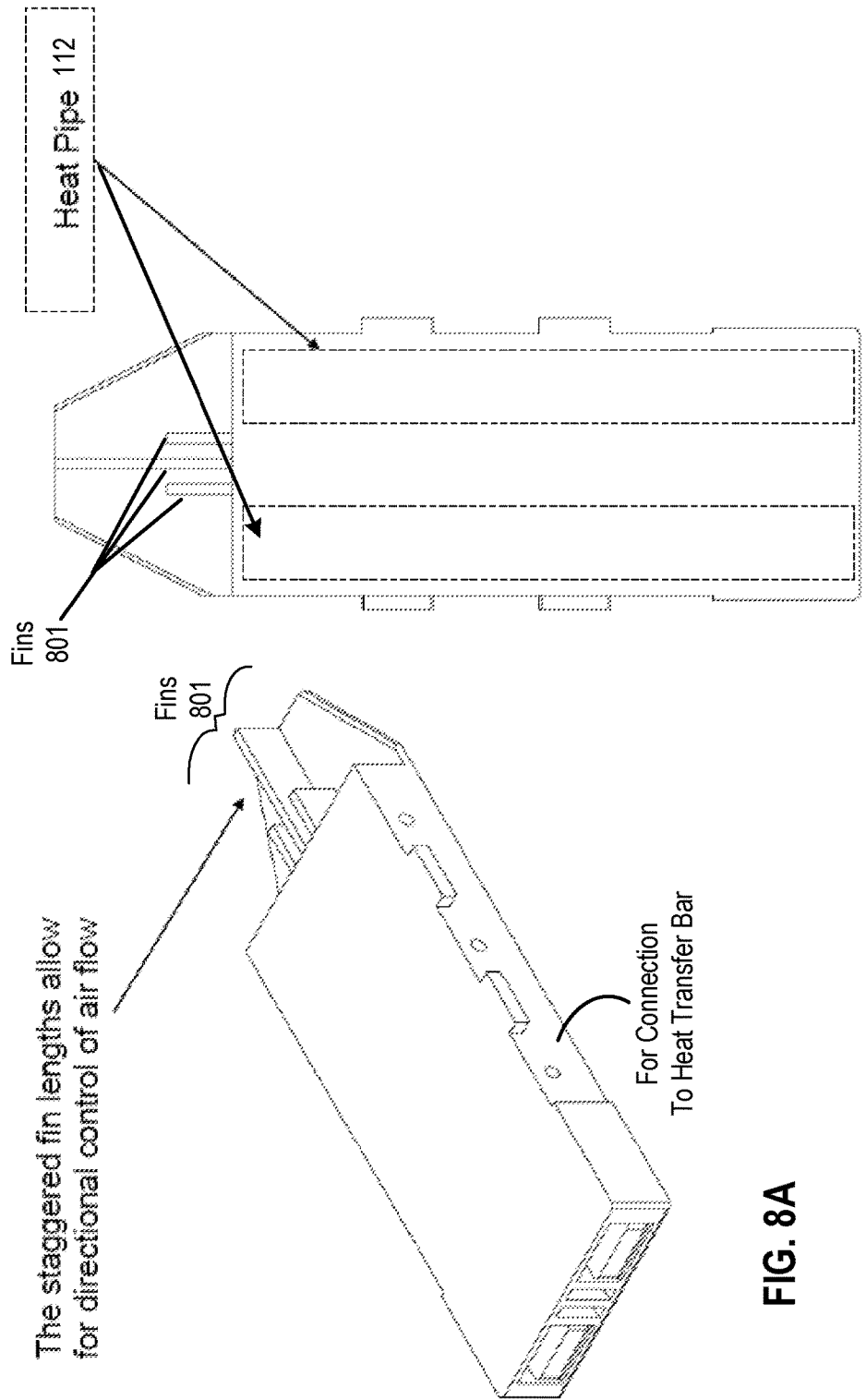

RECEPTICLE ASSEMBLY WITH THERMAL MANAGEMENT

FIELD OF THE INVENTION

Embodiments of the present invention relate to the field of input/output (I/O) connectors for computing devices; more particularly, embodiments of the present invention relate to an I/O connector with a thermal management assembly to dissipate heat of the I/O connector.

BACKGROUND OF THE INVENTION

Input/Output (I/O) connectors are commonly used to provide connectivity between components within a computing system. Examples of common I/O connectors include small foreign factor pluggable (SFP), quad form-factor pluggable (QSFP), miniSAS, and PCIe connectors.

Typically, an I/O connector system includes cable assembly and a board mounted connector. The cable assembly, which includes a pair of plug connectors on opposite ends of a cable, is configured to transmit signals over a desired distance. The board mounted connectors typically include a receptacle positioned in a panel with the receptacle configured to receive and mate with the plug connector.

I/O connectors use different techniques to manage thermal energy in rack type mounting systems. Typically, the rack includes a cage configured with an upper port and a lower port. In these arrangements, a heat sink is often readably adapted to engage a module positioned in the upper port but not when positioned in a lower port. In these instances, other thermal management structures have been employed, such a directed air flow and other thermal transfer methods such as thermal conductors to engage the module and channel the thermal energy to a location outside the cage. These methods can be costly and use valuable space limited options for adjacently positioned I/O connectors, especially high-density architectures.

SUMMARY OF THE INVENTION

A method and apparatus are disclosed herein for managing thermal dissipation in a receptacle assembly. In one embodiment, the receptacle assembly comprises a cage with a front face, a rear face, the front face having a plurality of ports; and a heat transfer unit having a thermal interface disposed with the cage, one or more heat transfer bars coupled, via openings in the cage, to sides of the thermal interface and are external to the cage, and a heat sink coupled to the one or more heat transfer bars, where the heat transfer unit is movable in a vertical direction in response to insertion of a module into one of the plurality of ports.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIGS. 2A and 2B illustrate an embodiment of a receptacle assembly with the heat transfer unit.

FIGS. 3A and 3B illustrate alternative embodiments of a receptacle assembly.

FIGS. 5A and 5B illustrate side section views of one embodiment of a receptacle assembly.

FIGS. 8A and 8B illustrate one embodiment of a bottom thermal interface.

DETAILED DESCRIPTION OF THE PRESENT INVENTION

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

FIGS. 1-8 illustrate a connector scheme that includes a receptacle assembly with thermal management. In one embodiment, the receptacle assembly comprises a cage and a heat transfer unit and includes at least one input/output (I/O) connector. In one embodiment, the cage has a top and bottom with two side walls on opposite sides of the cage, which coupled together form a front face and a rear face, with the connector being disposed within the cage. In one embodiment, the front face has one or more ports (e.g., two ports, three ports, etc.) for each receiving a plug-in module. In one embodiment, the heat transfer unit comprises a thermal interface disposed with the cage, heat transfer bars outside of the cage that are coupled, via openings in the cage walls, to sides of the thermal interface, and a heat sink coupled to the heat transfer bars. These components help dissipate heat from the cage, the connector within the cage, and any plug-in module inserted into the cage and mating with the connector. In one embodiment, the heat transfer bars are offset with respect to each other (relative to the top and bottom of the cage) as is described in more detail below. The offset nature of the two heat transfer bars is advantageous in that it allows multiple receptacle assemblies to be positioned next to each other in close proximity.

In one embodiment, the thermal interface also comprises at least one air vent or passage that is able to direct air that is received by the front face of the cage in the direction of the heat sink outside of the rear face. In one embodiment, the thermal interface comprises a plurality of fins having staggered lengths. In one embodiment, the air vent includes a heat pipe to help dissipate heat into the air that passes through the vent.

Figure 1:
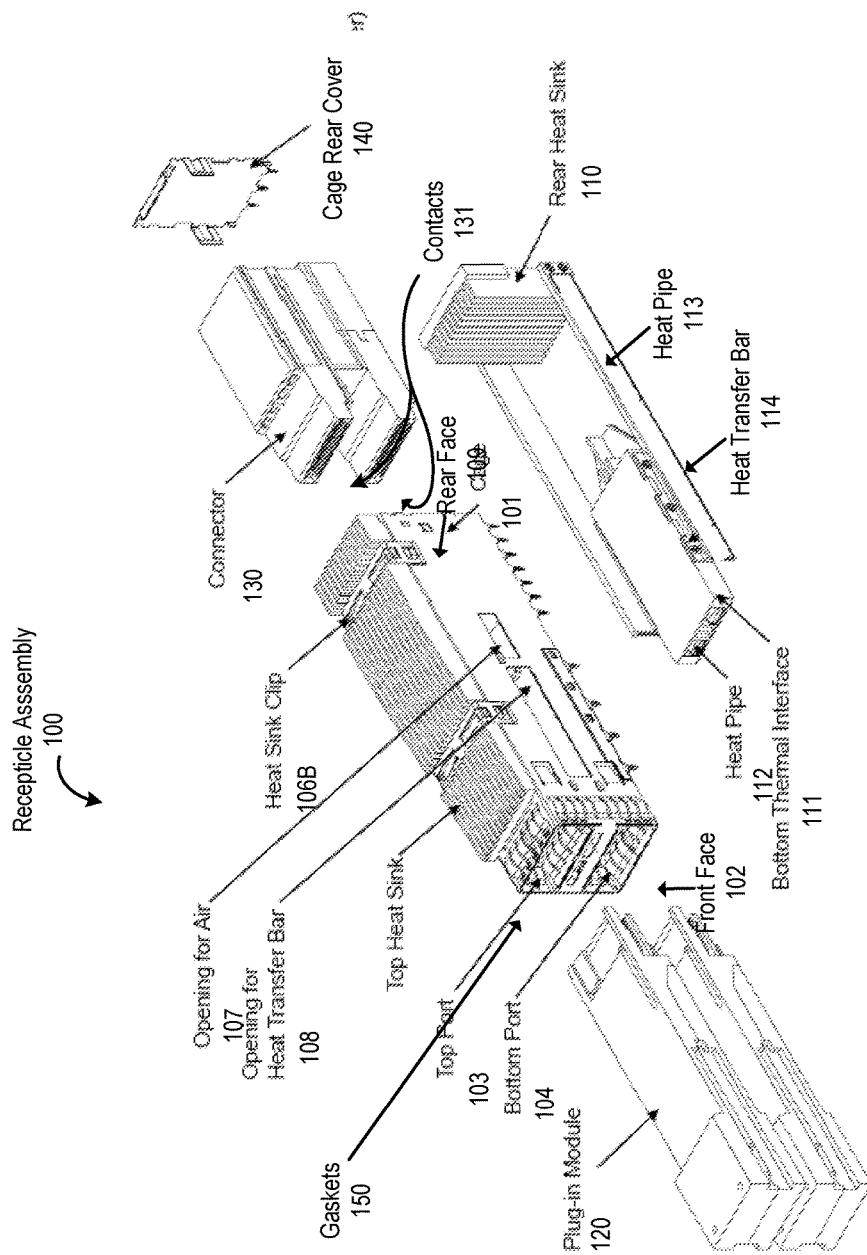
FIG. 1 illustrates one embodiment of a receptacle assembly.

FIG. 1 illustrates one embodiment of a receptacle assembly. The receptacle assembly can be positioned on a substrate (e.g., a circuit board, etc.) where its ports can receive mating plug-in modules.

Referring to FIG. 1, receptacle assembly 100 has a cage 101 disposed around a connector 130 and secured to a circuit board so as to provide an enclosure. In one embodiment, cage 101 has a front face 102 and a rear face 109. Cage 101 includes side walls that define an inner space between, as well as a top (not shown) and a bottom (not shown). Cage 101 includes a front opening connected with top port 103 and a bottom opening connected with a bottom port 104.

Top heat sink 105 is attached to the top of cage 101. In one embodiment, heat sink 105 is attached to cage 101 via heat sink clips 106A and 106B. Note that heat sink 105 can be attached to cage 101 in other ways, such as, for example but not limited to, adhesive, screws or other mechanical fasteners, solder, etc. In one embodiment, heat sink 105 includes fins directed away from cage 101 to dissipate heat away from cage 101.

In one embodiment, receptacle assembly 101 is positioned over connector 130 which is mounted on a corresponding substrate (e.g., a printed circuit board (PCB), etc.). The opening formed on the bottom of cage 101 allows connector 130 to be exposed to the interior of receptacle assembly 101 while still mating to the supporting circuit board.

In one embodiment, connector 130 is disposed in the rear half of cage 101. That is, connector 130 is spaced apart from the front opening of cage 101 and is positioned next to a cage rear cover 140 which forms part of the rear face 109 when connector 130 is disposed within cage 101. In one embodiment, connector 130 is a stacked connector that includes rows of contacts 131, at least one of which is positioned in each of top port 103 and bottom port 104, for mating an inserted connector from a plug-in module, such as plug-in module 120.

Cage assembly 100 also includes a heat transfer unit that dissipates heat from cage 101 and connector 130. In one embodiment, the heat transfer unit comprises a bottom thermal interface 111 that is disposed within cage 101 to collect and dissipate heat from components within cage 101. In one embodiment, the heat transfer unit also includes rear heat sink 110. In one embodiment, rear heat sink 110 is formed from a thermally conducted material (e.g., aluminum or other metal) and is positioned near the rear face of cage 101. In one embodiment, rear heat sink 110 has a body that includes a plurality of fins with corresponding channels defined between the fins.

In one embodiment, thermal interface 111 is coupled to rear heat sink 110 via thermal conductive structures, such as heat transfer bars. For example, in one embodiment, heat transfer bar 114 couples one side of thermal interface 111 to rear heat sink 110. Another heat transfer bar and heat pipe are coupled the other side of thermal interface 111 to other side of rear heat sink 110. In one embodiment, heat transfer bars comprise metallic structures. In one embodiment, heat transfer bars such at heat transfer bar 114 are attached to thermal interface 111 via screws. In alternative embodiments, heat transfer bars are attached to thermal interface 111 via adhesives, clips, solder, screws or other mechanical fasteners, etc.

In one embodiment, the coupling between thermal interface 111 and heat transfer bars, such as heat transfer bar 114, occurs through an aperture, or opening, such as opening 108, in the side of cage 101 when thermal interface 111 is disposed within cage 101. A similar opening is located on the other side of cage 101. The location of opening 108 is such that thermal interface 111 is disposed within cage 101 in an area between the plug-in modules that are inserted into top port 103 and bottom port 104.

Note that some or all of thermal interface 111, the one or more heat transfer bars (e.g., heat transfer bar 114), and rear heat sink 110 represent individual parts or pieces that are coupled or attached to each other via some coupling means or are coupled or attached to each other due to their being a single integrated part.

In one embodiment, a heat pipe is coupled to each of the heat transfer bars of the heat transfer unit. For example, heat pipe 113 is attached to heat transfer bar 114. In one embodiment, heat pipe 113 is attached to heat transfer bar 114 using an adhesive. Alternatively, heat pipe 113 is attached to heat transfer bar 114 using other means, such as, for example, clips, solder, mechanical fasteners (e.g., screws), etc. The heat pipes (e.g., heat pipe 113) and the heat transfer bars dissipate heat as well as transfer heat from thermal interface 111 to rear heat sink 110.

Cage 101 also includes gaskets 150. Gaskets 150 are secured around the front opening and the front portion of cage 101. In one embodiment, gaskets 150 provide an electro-magnetic interference (EMI) seal for when cage 101 is amounted in a rack. As is shown, gaskets 150 can include resilient spring fingers that extend into ports 103 and 104 and spring fingers that extend away from the ports. These spring fingers that extend into the ports can be configured to engage the body of plug-in module 120 inserted into ports 103 and 104 and the outwardly extending spring fingers are configured to engage a bezel.

In one embodiment, cage 101 includes a number of openings, or apertures, in its side walls. As discussed above, one set of two openings enable the coupling of heat transfer bars to a thermal interface disposed within cage 101. These openings and other openings formed in the side of cage 101 allow air flow to flow in and out of receptacle assembly 101. Additional openings such as formed in the front face allow air flow to pass in and out of the interior section of cage 101. In one embodiment, a cage rear cover (panel) 140 may include openings that allow additional airflow to enter and leave through cage 101, thereby providing an additional airflow path for thermal energy removal.

FIG. 2A illustrates one embodiment of a receptacle assembly with portions of a heat transfer unit disposed therein. Referring to FIG. 2A, rear heat sink 110 of a heat transfer unit (such as shown in FIG. 1) is positioned near the rear face of receptacle assembly 100 with its fins directed toward the rear face of receptacle assembly 100. FIG. 2B illustrates the same receptacle assembly as shown in FIG. 2A with a plug-in module plugged into the front face of a receptacle assembly. Referring to FIG. 2B, plug-in module 120 is plugged into the front face of receptacle assembly 100.

FIGS. 3A and 3B illustrate alternative embodiments of one embodiment of a receptacle assembly. Referring to FIGS. 3A and 3B, a rear heat sink 110 of a heat transfer unit (such as shown in FIG. 1) is positioned near the rear face of receptacle assembly 100 with its fins directed away from the rear face of receptacle assembly 100.

Figures 4A, 4B:
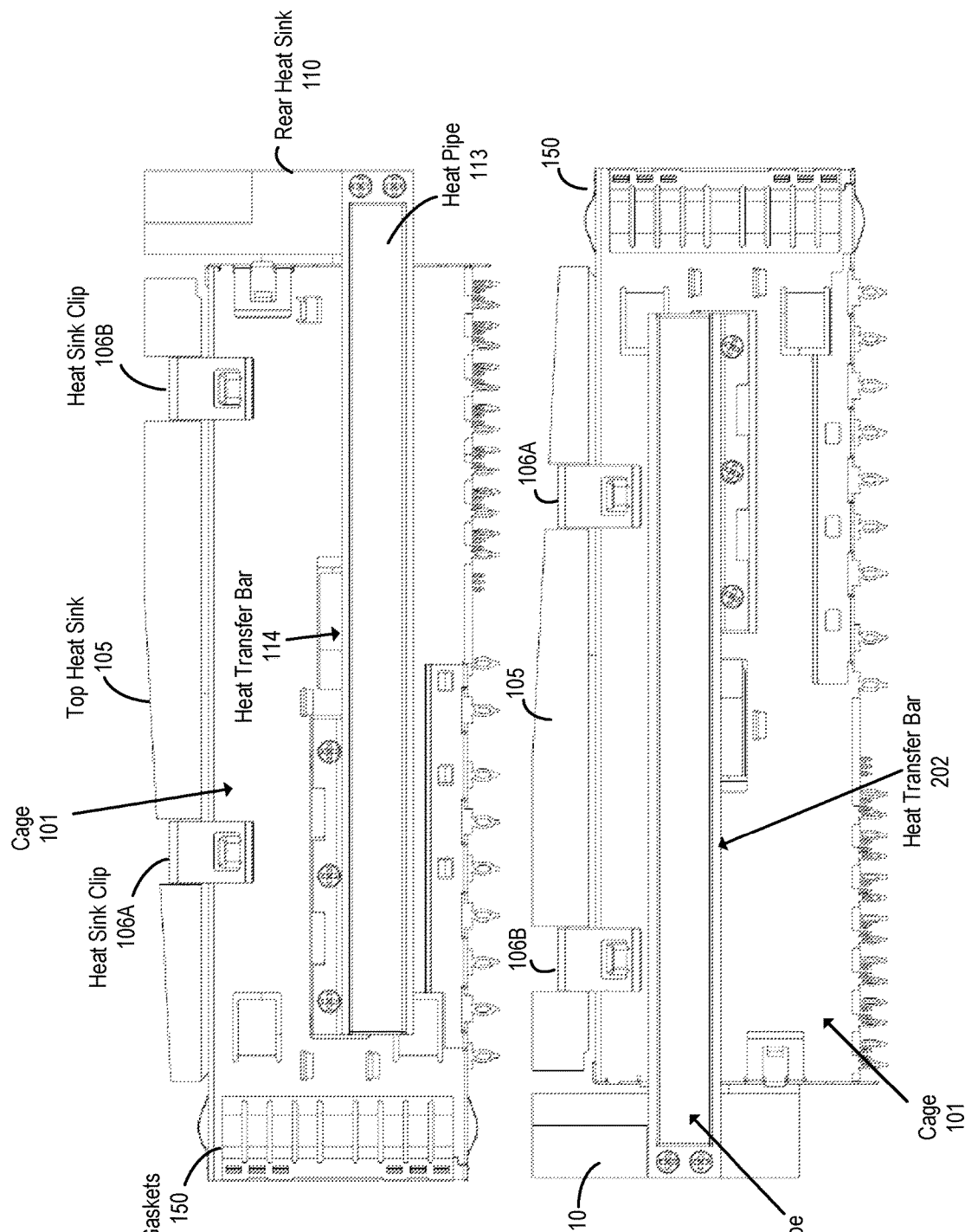
FIGS. 4A and 4B illustrate two different side views of one embodiment of a receptacle assembly with a heat transfer unit.

FIGS. 4A and 4B illustrate two different side views of one embodiment of a receptacle assembly with a heat transfer unit. Referring to FIG. 4A, a heat transfer bar 114 is shown coupling thermal interface (such as thermal interface 111 of FIG. 1) to heat pipe 113. As shown, the heat transfer bar 114 is also coupled at the bottom of rear heat sink 110. Note that heat pipe 113 is located below the point at which heat transfer bar 114 is coupled to thermal interface 111. That is, heat pipe 113 is attached to heat transfer bar 114 such that it is below the locations of the screws that attach heat transfer bar 114 to the thermal interface.

FIG. 4B illustrates the other side view of a cage assembly of FIG. 4A with a heat transfer unit. Referring to FIG. 4B, heat transfer bar 202 is coupled to the thermal interface (such as thermal interface 111 of FIG. 1) and is attached to rear heat sink 110. Heat pipe 201 is attached to heat transfer bar 202. In one embodiment, heat pipe 201 is attached to heat transfer bar 202 above the location at which heat transfer 202 is attached (e.g., secured via screws) to the bottom thermal interface. Note that heat transfer bar 202 is not attached to the bottom of rear heat sink 110 as in the case of heat transfer bar 114 in FIG. 4A. That is, heat transfer bar 202 is attached to rear heat sink 110 at a point on rear heat sink 110 that is higher up along the side of rear sink heat 110. In one embodiment, heat transfer bar 202 is attached to heat sink 110 at a higher distance that is equal to more than the width of its attached heat pipe and the portions of heat transfer bar 202 that are above and below the attached heat pipe in the area of the attachment of heat transfer bar 202 to rear heat sink 110. Thus, heat pipe 201 is higher along the side of cage 101 than that of heat pipe 113.

In one embodiment, the heat transfer unit is movable in a vertical direction in response to insertion of plug-in modules into its ports. More specifically, in one embodiment, thermal interface 111 moves vertically upward (e.g., toward an upper port above it) in response to a plug-in module being inserted and mating with a connector disposed within the lower port below it. When the plug-in module is inserted in the lower port below, thermal interface 111 is moved up to have increased thermal contact with module plugged into the upper port above it. This increased thermal conduct is through springs or other thermal conductors that are coupled between a port surface and thermal interface 111.

In one embodiment, the vertical movement of thermal interface 111 due to a plugin module being plugged into the lower port below thermal interface 111 also causes the plug-in module in the upper port above thermal interface 111 to become thermally connected to the heat sink at the top of the cage (e.g., the top heat sink of FIG. 1 clipped to cage 101 via clips 106A and 106B). In other words, the vertical movement of thermal interface 111 causes the plug-in module above it to be pushed into thermal contact with the top heat sink and/or the heat sink clips.

FIGS. 5A and 5B illustrate side section views of one embodiment of receptacle assembly 101 illustrating the result of modules being inserted into ports of the receptacle assembly. Referring to FIG. 5A, the side section view illustrates thermal interface 111 contacting an interior surface within cage 101 such that the surface physically contacts a plug-in module when the plug-in module is inserted into the front face and mates with contacts (e.g., contacts 131) of the connector (e.g., connector 130 of FIG. 1) that is disposed within the case. Springs 501 are shown for making thermal contact between thermal interface 111 and the surface that contacts the plug-in module when inserted and coupled to connector connector assembly. Note that two springs are shown in FIG. 5A. Alternatively, only one spring or more than two springs (e.g., 3, 4, 5, etc.) may be used to provide a thermal connection between thermal interface 111 and a plug-in module that is inserted into the case.

FIG. 5B illustrates plug-in module 120 inserted into the lower port in the front face of the receptacle assembly causing the thermal interface 111 to move vertically upward and into more thermal contact with springs 501. This causes springs 501 to be in a more compressed state to be in a more compressed state and in contact with thermal interface 111. The vertical movement of thermal interface 111 causes the plug-in module 120 in the port above the thermal interface to be push upward into more contact with the top heat sink and/or its clips (mechanical fasteners), thereby creating an increase thermal interface between the two.

Figure 6:
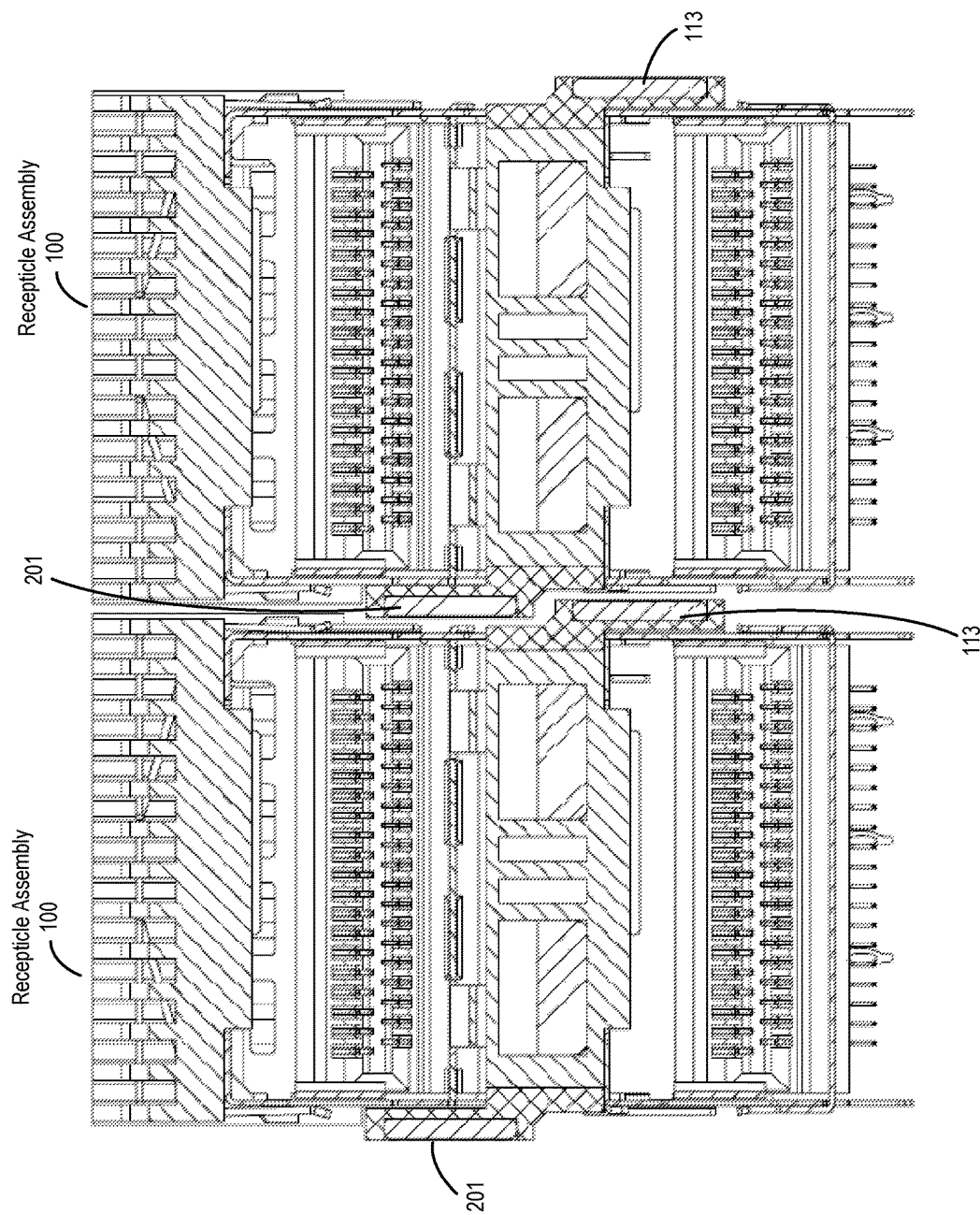
FIG. 6 illustrates a pair of receptacle assemblies next to each other in accordance with one embodiment.

FIG. 6 illustrates a pair of receptacle assemblies positioned next to each other according to one embodiment. Referring to FIG. 6, front views of two receptacle assemblies 100 that are positioned adjacent to each other are shown, with each receptacle assembly having two heat pipes 113 and 201 as shown. Because the heat pipes on each side of the case assembly, namely heat pipes 113 and 201, are offset with respect to each other along the sides of cage assembly (i.e., heat pipe 201 is higher up the side of the cage than heat pipe 113), the two cage assemblies may be placed next to each other in a much closer spacing than if the heat pipes had been positioned at the same point along the opposite sides of the cage assembly. This is, because the heat pipes are located outside the receptacle assembly causing the receptacle assembly to be wider at the location of the heat pipe, this added width would limit how close two receptacle assemblies could be place together if both had their added width in the same location.

Figure 7:
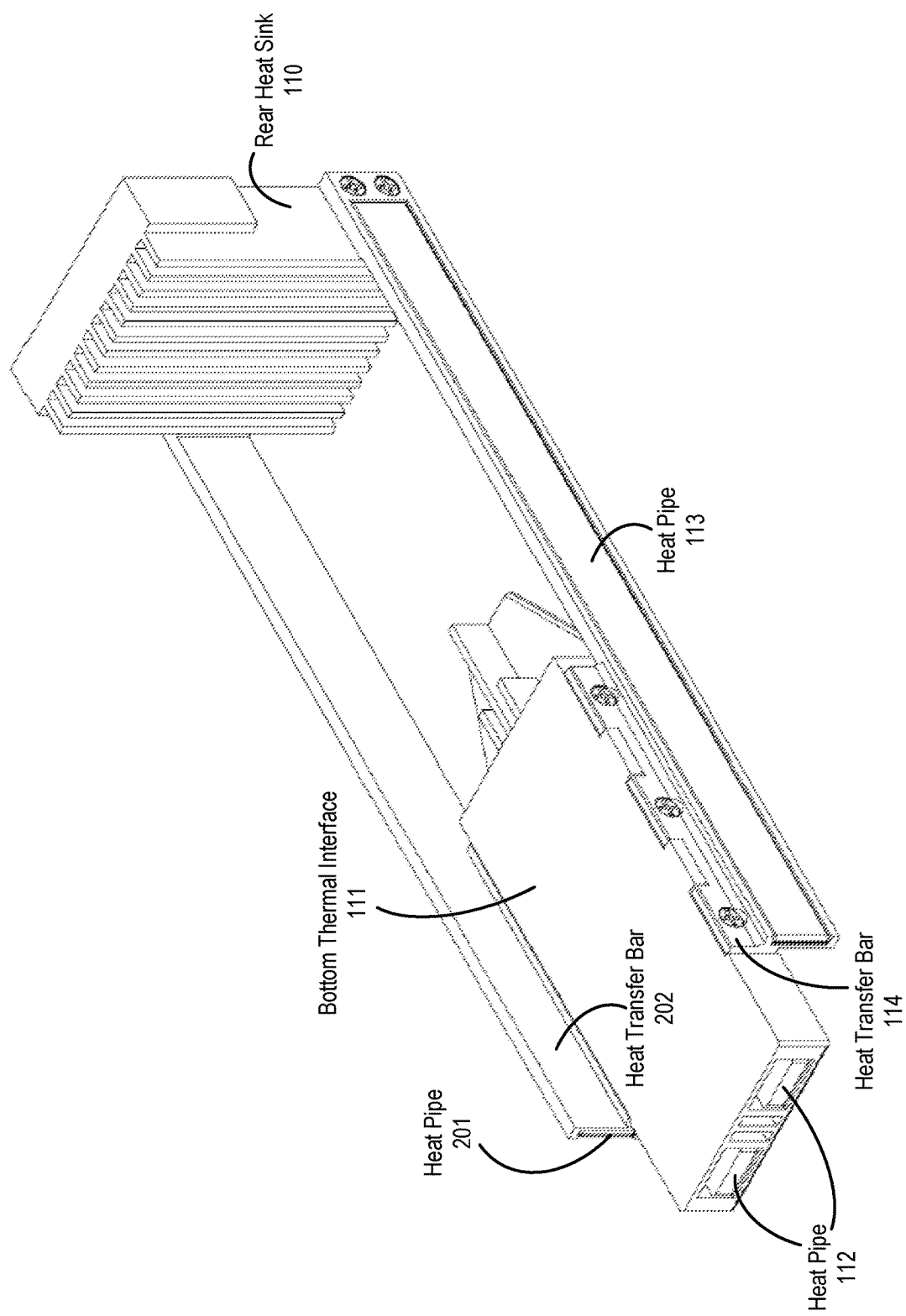
FIG. 7 illustrates one embodiment of a heat transfer unit.

FIG. 7 illustrates one embodiment of a heat transfer unit. Referring to FIG. 7, thermal interface 111 is shown with heat transfer bars 114 and 202 attached thereto. A heat pipe 201 is attached to heat transfer bar 202, while heat pipe 113 is attached to heat transfer bar 114. Rear heat sink 110 is shown with its fins pointing in a direction that would be toward a receptacle assembly if thermal interface 111 is disposed within the receptacle assembly.

In one embodiment, by having a heat sink coupled to the one or more heat transfer bars and positioned rear of the cage, the fins that extend from a base of the heat sink may be directed towards an air flow direction. Because of this position, the fins or base of the heat sink act that face an air flowing direction act to trap air. This improves heat dissipation.

In one embodiment, thermal interface 111 includes heat pipes 112 that are included within air flow channels that in bottom thermal interface 111. Heat pipes 112 in conjunction with the air flow channels facilitate the heat transfer from thermal interface 111 away from the receptacle assembly. Note that while thermal interface 111 is shown with two air flow channels and two heat pipes within those channels, embodiments of the present invention are not limited to such a number of air flow channels and heat pipes. For example, in another embodiment, only one air flow channel and heat pipe are included in thermal interface 111. Alternatively, three or more air flow channels and heat pipes within those channels are included in thermal interface 111.

FIGS. 8A and 8B illustrate one embodiment of a bottom thermal interface. In one embodiment, the thermal interface of FIGS. 8A and 8B comprise thermal interface 111 of FIG. 1. Referring to FIGS. 8A and 8B, heat pipes 112 are shown extending throughout two air flow channels, or passages, of the thermal interface. In one embodiment, the air flows through the thermal interface when air flow is directed from the front face of the receptacle assembly through the rear face of the receptacle assembly.

In one embodiment, the thermal interface includes fins 301 that have lengths that are staggered. The staggered links of fins 801 allow for directional control of the air flow. In one embodiment, the thermal interface including fins similar to a heat sink (e.g., rear heat sink 110). In one embodiment, thermal interface comprises a metallic structure.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:
1. A receptacle assembly comprising:
  a cage with a front face, a rear face, the front face having a plurality of ports; and
  a heat transfer unit having a thermal interface disposed within the cage,
one or more heat transfer bars external to the cage and coupled, via openings in the cage to sides of the thermal interface, and
a heat sink coupled to the one or more heat transfer bars and located at the rear face of the cage,
wherein the heat transfer unit is movable in a vertical direction in response to insertion of a module into one of the plurality of ports.

2. The receptacle assembly defined in claim 1 wherein the thermal interface is operable to move vertically toward an upper port of the plurality of ports in response to a module being inserted into a lower port of the plurality of ports and mating with a connector disposed within the cage.

3. The receptacle assembly defined in claim 2 wherein the thermal interface is disposed in the cage between the upper and lower ports of the plurality of ports, and further comprising:
a surface in a bottom of the upper port operable to be in thermal contact with a first module plugged into the upper port; and
one or more thermal conductors thermally coupling the surface to the thermal interface when a second module is plugged into the lower port, wherein insertion of the second module into the lower port causes the thermal interface to move closer to the upper port.

4. The receptacle assembly defined in claim 3 wherein the one or more thermal conductors comprises one or more springs.

5. The receptacle assembly defined in claim 3 further comprising a second heat sink at the top of the cage, wherein the first module is thermally connected to the second heat sink when the first module is plugged in the upper port and the second module is plugged into the lower port.

6. The receptacle assembly defined in claim 1 wherein the thermal interface comprises at least one air vent with at least one heat pipe.

7. The receptacle assembly defined in claim 1 wherein the thermal interface comprises a plurality of fins having staggered lengths.

8. The receptacle assembly defined in claim 1 wherein the one or more heat transfer bars are located outside of the cage and interface the thermal interface through openings in the cage.

9. The receptacle assembly defined in claim 8 further comprising a heat pipe coupled to at least one of the one or more heat transfer bars.

10. The receptacle assembly defined in claim 1 wherein the first heat sink is positioned with fins directed toward the rear face of the cage.

11. A receptacle assembly comprising:
a cage with a front face, a rear face, the front face having a plurality of ports; and
a heat transfer unit having
a thermal interface disposed within the cage,
first and second heat transfer bars external to the cage and coupled, via openings in the cage, respectively, to the thermal interface in an offset position with respect to each other, and
a heat sink coupled to the first and second heat transfer bars and located at the rear face of the cage.

12. The receptacle assembly defined in claim 11 wherein a portion of the first heat transfer bar is above the thermal transfer bar and a portion of the second heat transfer bar is below the thermal interface.

13. The receptacle assembly defined in claim 12 further comprising first and second heat pipes attached to the first and second heat transfer bars, respectively, such that at least a portion of the first heat pipe is above the thermal interface and a portion of the second heat pipe is below the thermal interface.

14. The receptacle assembly defined in claim 11 wherein the first and second heat transfer bars are attached to the first and second heat pipes, respectively, and coupling of first heat transfer bar to the thermal interface occurs below the first heat pipe and coupling of the second heat transfer bar to the thermal interface occurs above the second heat pipe.

15. The receptacle assembly defined in claim 11 wherein the thermal interface comprises at least one air vent.

16. The receptacle assembly defined in claim 15 wherein the thermal interface comprises at least one heat pipe in at least one of the at least one air vent.

17. The receptacle assembly defined in claim 15 wherein the thermal interface comprises a plurality of fins having staggered lengths.

18. The receptacle assembly defined in claim 11 wherein the one or more heat transfer bars are located outside of the cage and interface the thermal interface through openings in the cage.

19. The receptacle assembly defined in claim 11 wherein the heat sink is positioned with fins directed toward the rear face of the cage.

20. An apparatus comprising:
a circuit board;
a first receptacle assembly defined in claim 11 coupled to the circuit board; and
a second receptacle assembly defined in claim 11 coupled to the circuit board next to the first receptacle assembly, wherein the first heat transfer bar of the first receptacle assembly being the second heat transfer bar of the second receptacle assembly.

21. A receptacle assembly comprising:
a cage with a front face, a rear face, the front face having a plurality of ports; and
a heat transfer unit having
a thermal interface disposed within the cage,
one or more heat transfer bars external to the cage and coupled, via openings in the cage, respectively, to sides of the thermal interface, and
a heat sink coupled to the one or more heat transfer bars and positioned at the rear face of the cage.

22. The receptacle assembly defined in claim 21 wherein the heat sink comprises fins that extend from a base of the heat sink and are directed towards an air flow direction.

23. The receptacle assembly defined in claim 21 wherein fins or base of the heat sink act that face an air flowing direction act to trap air.

24. The receptacle assembly defined in claim 21 wherein the first and second heat transfer bars coupled are in an offset position with respect to each other.

25. The receptacle assembly defined in claim 23 wherein the one or more heat transfer bars are located outside of the cage and interface the thermal interface through openings in the cage.

26. The receptacle assembly defined in claim 24 further comprising a heat pipe coupled to at least one of the one or more heat transfer bars.

* * * * *